United States Patent

Hattori et al.

(10) Patent No.: US 6,629,007 B1
(45) Date of Patent: Sep. 30, 2003

(54) APPARATUS AND METHOD FOR NOTIFYING LACK OF COMPONENT IN ADVANCE, COMPONENT MOUNTING APPARATUS, AND ARTICLE OF MANUFACTURE COMPRISING COMPUTER USABLE MEDIUM

(75) Inventors: Yoshiyuki Hattori, Kofu (JP); Satoshi Nonaka, Yamanashi-ken (JP); Takeshi Kuribayashi, Yamanashi-ken (JP)

(73) Assignee: Matsushita Electric Industrial Co., Ltd., Osaka-Fu (JP)

( * ) Notice: Subject to any disclaimer, the term of this patent is extended or adjusted under 35 U.S.C. 154(b) by 0 days.

(21) Appl. No.: 09/468,306

(22) Filed: Dec. 21, 1999

(30) Foreign Application Priority Data

Dec. 25, 1998 (JP) .......................... 10-370672

(51) Int. Cl.⁷ .............................. G06F 19/00
(52) U.S. Cl. .................. 700/100; 700/97; 700/242
(58) Field of Search ............... 700/95, 96, 97, 700/100, 105, 108, 109, 111, 112, 117, 242

(56) References Cited

U.S. PATENT DOCUMENTS

| | | | | |
|---|---|---|---|---|
| 4,999,909 A | * | 3/1991 | Eguchi et al. | 29/740 |
| 5,228,193 A | | 7/1993 | Yanagawa et al. | 29/832 |
| 5,295,294 A | * | 3/1994 | Ito | 29/740 |
| 5,319,845 A | * | 6/1994 | Watanabe et al. | 29/701 |
| 5,319,846 A | * | 6/1994 | Takahashi et al. | 29/740 |
| 5,329,690 A | | 7/1994 | Tsuji et al. | 29/430 |
| 5,442,566 A | * | 8/1995 | Imafuku et al. | 700/213 |
| 5,979,045 A | * | 11/1999 | Nishimori et al. | 29/832 |
| 6,257,391 B1 | * | 7/2001 | Nishimori et al. | 198/358 |
| 6,259,966 B1 | * | 7/2001 | Izumida et al. | 700/229 |

FOREIGN PATENT DOCUMENTS

| | | |
|---|---|---|
| EP | 0 437 634 | 7/1991 |
| EP | 0 476 577 | 3/1992 |
| JP | 10-112598 | 4/1998 |

* cited by examiner

*Primary Examiner*—Leo Picard
*Assistant Examiner*—Chad Rapp
(74) *Attorney, Agent, or Firm*—Wenderoth, Lind & Ponack, L.L.P.

(57) ABSTRACT

A component-lack advance notice method, a component-lack advance notice apparatus, and a component mounting apparatus including the component-lack advance notice apparatus, wherein a producible count determination part and advance notice parts are provided, so that an advance notice time from an advance notice of a lack of components to an actual occurrence of a lack of components is set beforehand. The producible count determination part obtains each advance notice remaining count of components to be supplied within the advance notice time from each component feed part on the basis of the advance notice time, and notifies a lack of components in advance on the basis of the advance notice remaining count.

20 Claims, 15 Drawing Sheets

| | | | |
|---|---|---|---|
| ADVANCE NOTICE TIME | 5 MINUTES | | |
| ESTIMATED PRODUCTION TIME | 60 SECONDS | | |
| Z NUMBER | COMPONENT FEED COUNT | PRODUCIBLE COUNT | ADVANCE NOTICE REMAINING COUNT |
| 1 | 5 | 5 | 25 |
| 2 | 3 | 5 | 15 |
| 3 | 3 | 5 | 15 |
| 4 | 2 | 5 | 10 |
| 5 | 1 | 5 | 5 |
| ⋮ | ⋮ | ⋮ | ⋮ |

Fig.11

| BLOCK | X (mm) | Y (mm) | Z NUMBER |
|---|---|---|---|
| 1 | 0.00 | 0.00 | 1 |
| 2 | 0.00 | 2.00 | 1 |
| 3 | 0.00 | 4.00 | 1 |
| 4 | 0.00 | 6.00 | 3 |
| 5 | 0.00 | 8.00 | 5 |
| ⋮ | | | |

Fig.12

| Z NUMBER | COMPONENT NAME |
|---|---|
| 1 | A |
| 2 | |
| 3 | B |
| 4 | |
| 5 | C |
| ⋮ | |

*Fig.14*

| Z NUMBER (33) | COMPONENT REMAINING COUNT (45) | ADVANCE NOTICE REMAINING COUNT (46) |
|---|---|---|
| 1 | 2000 | 50 |
| 2 | 500 | 50 |
| 3 | 500 | 40 |
| 4 | 1000 | 40 |
| 5 | 20 | 30 |
| ⋮ | ⋮ | ⋮ |

APPARATUS AND METHOD FOR NOTIFYING LACK OF COMPONENT IN ADVANCE, COMPONENT MOUNTING APPARATUS, AND ARTICLE OF MANUFACTURE COMPRISING COMPUTER USABLE MEDIUM

BACKGROUND OF THE INVENTION

The present invention relates to a method for notifying in advance the lack of a component at a component feed device which is set in a component mounting apparatus for mounting, e.g., electronic components onto a circuit board and feeds the electronic components, an apparatus for notifying in advance lack of component and carrying out the method for notifying in advance the lack of a component, a component mounting apparatus including the apparatus for notifying in advance the lack of a component or carrying out the method, and an article of manufacture comprising a computer usable medium for the apparatus for notifying in advance the lack of a component.

An example of a constitution of a conventional component mounting apparatus will be described with reference to FIGS. 10–13.

FIG. 10 shows an appearance of a conventional component mounting apparatus 1 which roughly comprises an orthogonal table 12 which is movable to directions of X and Y orthogonal to each other, a component feed device 13, a feed table 14, a component hold device 15, a circuit board transfer device 18, and a control device 20. In FIG. 10, a display part 10 has a screen for displaying a state of the component mounting apparatus 1 and contents of data. An input device 11 has a keyboard for use in inputting data, etc.

The orthogonal table 12 is a table for holding and positioning a circuit board 2 to mount electronic components to the circuit board 2. The table is movable in X, Y directions orthogonal to each other.

The component feed device 13 in the example is constituted of reel-type parts cassettes 13a, each of which has a mechanism for continuously supplying the electronic component from a reel to which a tape storing the electronic components is wound. As shown in the drawing, a plurality of parts cassettes 13a are arranged side by side in the X direction. FIG. 13 indicates an appearance of one parts cassette 13a. 13a-1 is a component suction part positioned to correspond to a nozzle 15b of the component hold part 15 which will be described later, where the electronic component to be sucked by the nozzle 15b is located. 13a-2 is a reel hold part holding the reel. 13a-3 is a component feed part for sending the tape from the reel to the component suction part 13a-1 every time the component mounting apparatus 1 pushes in a feed lever.

The feed table 14 loads the component feed device 13 removably and can move in the X direction along a rail 16 extending in the X direction. The feed table 14 has unique numbers (referred to as Z numbers hereinafter) at each position in the X direction where the feed table loads each of the parts cassettes 13a to recognize each of the 43 positions.

According to the example, the component hold device 15 is of a rotary head type including a plurality of mounting heads 15a and a plurality of nozzles 15b corresponding, respectively, to the mounting heads 15a for sucking and thereby holding the electronic components. Although the component hold device 15 is rotatable in a direction about a rotational center axis designated by an arrow 17, the device never moves in the X, Y directions. Each nozzle 15b can move up and down in parallel to a direction in which the nozzle extends.

The circuit board transfer device 18 transfers the circuit boards 2 to the component mounting apparatus 1 and sends the circuit boards 2 out of the component mounting apparatus 1.

The control device 20 controls operations of the above-described parts constituting the apparatus thereby controlling a mount operation for electronic components to the circuit boards 2.

Components are mounted in the following manner in the component mounting apparatus 1 constituted as described above.

The feed table 14 moves the parts cassette 13a holding a desired electronic component to be mounted to the circuit board 2 to a component hold position where the electronic component can be sucked by the nozzle 15b. On the other hand, the orthogonal table 12 moves in the X, Y directions to position the nozzle 15b in holding the electronic component to a desired mount position on the circuit board 2. After holding the electronic component from the parts cassette 13a positioned by the feed table 14, the nozzle 15b of the component hold device 15 rotates in the direction 17 about the axis, lowers and mounts the electronic component to the mount position positioned by the orthogonal table 12.

FIG. 11 shows a structure of data for use in executing the above-described mount operation, i.e., data regulating positions of the components to be mounted on the circuit board 2 and a mount order. The data structure is called an NC program. In FIG. 11, 30 designates the structure of the entire NC program, 31 is a block number showing the mount order. 32 is a mount coordinate showing positions of components to be mounted on the circuit board 2. The position of each component is defined by two-dimensional coordinates based on a reference position on the circuit board 2 as an origin. 33 is the earlier-mentioned Z number showing an arrangement position of each parts cassette 13a at the feed table 14.

FIG. 12 shows a structure of data regulating types of electronic components stored in the parts cassettes 13a arranged on the feed table 14. The data structure is called as an array program. 40 in FIG. 12 indicates an entire structure of the array program, and "Z numbers" in the array program 40 correspond to the Z numbers 33 in the NC program 30. 42 is a component name of the electronic component stored in each parts cassette 13a with the Z number, which consists of a character string defining a type of the component uniquely.

FIG. 14 is an example of a screen display pattern for use in inputting a count of remaining components and an advance notice count of remaining components for each Z number 33 in the array program 40 in the component feed device 13 placed on the feed table 14. "Z numbers" in FIG. 14 correspond to the Z numbers 33 in the array program 40. 45 is the count of remaining components in each parts cassette 13a corresponding to each Z number 33 which is input by a worker before a start of production. 46 is the advance notice count of remaining components. When the count of components actually remaining in each parts cassette 13a with the Z number 33 becomes smaller than the input advance notice count of remaining components, the fact is informed to the worker.

FIG. 15 is a block diagram of the conventional processing structure for notifying the lack of components in advance. In FIG. 15, 50 is an input part including the display part 10 shown in FIG. 10 for displaying the screen display pattern of FIG. 14, etc. and the input device 11 having a keyboard or the like input device. 51 is a management part for managing the count of remaining components which subtracts one from the count 45 of remaining components input through the input part 50 every time a component is used during the production and keeps the count. 52 is an advance notice judgment part which compares the advance notice count 46 of remaining components input through the input part 50 with the count 45 of remaining components kept by the management part 51 and sends out a signal to a notification part 53 when the count 45 becomes smaller than the advance notice count 46. The notification part 53 informs the worker upon receipt of the signal from the advance notice judgment part 52 that the lack of components is nearing.

The above management part 51 and advance notice judgment part 52 are included in the control device 20.

The procedure for checking component names and registering the count of remaining components when product types are to be switched in the thus-constituted component mounting apparatus 1 will be described with reference to FIGS. 10 through 15 and flow charts of FIGS. 16 and 17.

FIG. 16 is a flow chart showing procedures on an occasion of switching the production types. Referring to FIG. 16, the NC program 30 and the array program 40 to be used for the switch of production types are selected and registered in the control device 20 of the component mounting apparatus 1 (step 60). Each parts cassette 13a holding components is disposed on the feed table 14 while the component name 42 and the Z number 33 are made corresponding to each other in accordance with a definition of the selected array program 40 (step 61). The count 45 of remaining electronic components held in each parts cassette 13a is input and registered into the management part 51 through the screen display pattern of FIG. 14 (step 62). Moreover, the advance notice count 46 of remaining components for each parts cassette 13a is input and registered into the advance notice judgment part 52 based on the same screen display pattern (step 63).

In the foregoing description of the example, the count of remaining components kept in each parts cassette 13a is directly input based on the screen display pattern shown in FIG. 14. However, an alternative method is adoptable, whereby the count of remaining components registered from an external terminal or the like to a memory medium installed in the component feed device 13 is read by a read device set at the component mounting apparatus 1 before the production start, and the read count of remaining components is automatically registered in the management part 51.

In addition, although the count of remaining components in each parts cassette 13a is input from the screen display pattern independently of the array program 40 in the foregoing example, the count of remaining components can be registered in the management part 51 by quoting data directly related to the Z number 33 in the array program 40 or data defined for each component name 42.

FIG. 17 is a flow chart of procedures for advance notification of a lack of components during the production. In FIG. 17, the production is started (step 70), and every time the component is used from each parts cassette 13a, the count of remaining components of the parts cassette 13a from which the component is supplied is decremented at the management part 51 (step 71). In the parts cassette 13a from which the count of remaining components is decremented, the preliminarily set advance notice count 46 and the decremented count of remaining components are compared with each other at the advance notice judgment part 52 (step 72). At this time, if the decremented count of remaining components is smaller than the advance notice count 46, it is informed by the notification part 53 to the worker (step 73). The notifying lack of components is erased when a fresh component is supplemented to the component feed device 13 (step 75) after the lack of component actually takes place (step 74).

For notifying the worker, a message may be displayed at the notification part 153, a signal tower is turned on, or the like manner is used.

In the above-described related art arrangement, the count 45 of remaining components and the advance notice remaining count 46 should be registered for every parts cassette 13a whenever production types are switched, thereby requiring much time for the switching.

The advance notice remaining count 46 should be registered for each of the parts cassettes 13a. For example, if the same advance notice remaining count 46 is registered for all of the parts cassettes 13a in order to avoid the trouble, since a time from the advance notice of a lack of components to the actual occurrence of lacking components in a parts cassette 13a supplying many components is different from that of a parts cassette 13a not supplying many components, the advance notice of the lack of components tends to be informed for a plurality of parts cassettes 13a at one time and the like. Thus the worker is confused.

On the other hand, in the case where the advance notice remaining count 46 of a different value for each parts cassette 13a is to be registered, the number of use of each parts cassettes 13a should be detected beforehand for each production type, whereby the worker's work of referring to the NC program 30 and the array program 40, etc. is complicated and also a time for the registration of the advance notice remaining count 46 at the switch of production types is increased.

SUMMARY OF THE INVENTION

The present invention is devised to solve the aforementioned problems and has for its object to provide a method and an apparatus for notifying a component-lack in advance whereby a worker's burden when replacing components and switching production types of objects to be mounted is lightened and efficiency for the work is enhanced in comparison with the related art, a component mounting apparatus including the apparatus for notifying lack of component in a advance, and an article of manufacture comprising a computer usable medium for the apparatus for notifying in advance the lack of a component.

In order to accomplish the above-described objective, the present invention is constituted as follows.

According to a first aspect of the present invention, there is provided a component-lack advance notice apparatus for notifying lack of component in advance at each of a plurality of component feed parts, the lack of component being brought about when each of a plurality of components supplied with a different component count from each of the component feed parts constituting a component mounting apparatus is mounted to each of objects to be mounted, thereby producing component mounted objects, the apparatus comprising: a producible count determination part to which an advance notice time and an estimated production time are supplied, the advance notice time being a time from the advance notice of lack of component to an actual occurrence of lack of component at the component feed part and uniform for all component feed parts, the estimated production time being estimated to be required for producing one of the component mounted objects, the producible count determination part obtaining a producible count of the component mounted object within the advance notice time on the basis of the advance notice time and estimated production time and obtaining also an advance notice remaining count for each component feed part which is a count of components to be supplied from each component feed part within the advance notice time on the basis of the producible count and a count of components to be supplied from each component feed part per a production of one of the component mounted objects; and an advance notice part which notifies the lack of component in advance with respect to each component feed part when a count of remaining components at the component feed part becomes smaller than the advance notice remaining count at the component feed part corresponding to the count of remaining components.

In a component-lack advance notice method according to a second aspect of the present invention, there is provided a component-lack advance notice method for notifying lack of component in advance at each of a plurality of component feed parts, the lack of component being brought about when each of a plurality of components supplied with a different component count from each of the component feed parts is mounted to each of objects to be mounted, thereby producing component mounted objects, the method comprising: supplying a count of components to be supplied from each component feed part per a production of one of the component mounted objects; supplying an advance notice time and an estimated production time, the advance notice time being a time from the advance notice of lack of component to an actual occurrence of lack of component at the component feed part and uniform for all component feed parts, the estimated production time being estimated to be required for producing the one of the component mounted objects, and obtaining a producible count of the component mounted object within the advance notice time on the basis of the advance notice time and estimated production time and obtaining also an advance notice remaining count for each component feed part which is a count of components to be supplied from each component feed part within the advance notice time on the basis of the producible count and a count of components to be supplied from each component feed part per the production of the one of the component mounted objects; and notifying the lack of component in advance with respect to each component feed part when a count of remaining components at the component feed part becomes smaller than the advance notice remaining count at the component feed part corresponding to the count of remaining components.

A component mounting apparatus according to a third aspect of the present invention includes the component lack advance notice apparatus according to the first aspect.

According to the component-lack advance notice apparatus in the first aspect of the present invention, the component-lack advance notice method of the second aspect, and the component mounting apparatus of the third aspect, the producible count determination part and the advance notice part are provided, so that the advance notice time from the advance notice of lack of component to the actual lack of component can be set appropriately to conform to the production state in the apparatus, e.g., time required by a worker for a replacement of components, inventory management manner and the like. Thus an appropriate indication to the worker at the occurrence of the lack of component can be ensured, thereby favorably improving work efficiency.

The producible count determination part obtains the advance notice remaining count for each component feed part in accordance with the set advance notice time. Thus the conventional need for the worker to set the advance notice count for each component feed part is eliminated, whereby the time for switching types of objects to be mounted is shortened and the component mounting apparatus is improved in availability.

Further, in an article of manufacture comprising a computer usable medium according to a fourth aspect of the present invention, there is provided an article of manufacture comprising: a computer usable medium, including computer-readable program code embodied therein, for causing a computer to notify lack of component in advance at each of a plurality of component feed parts, the lack of component being brought about when each of a plurality of components supplied with a different component count from each of the component feed parts is mounted to each of objects to be mounted, thereby producing component mounted objects, the computer-readable program code in the article of manufacture comprising: computer-readable program code operable to supply a count of components to be supplied from each component feed part per a production of one of the component mounted objects; computer-readable program code operable to supply an advance notice time and an estimated production time, the advance notice time being a time from the advance notice of lack of component to an actual occurrence of lack of component at the component feed part and uniform for all component feed parts, the estimated production time being estimated to be required for producing the one of the component mounted objects, and obtain a producible count of the component mounted object within the advance notice time on the basis of the advance notice time and estimated production time and obtain also an advance notice remaining count for each component feed part which is a count of components to be supplied from each component feed part within the advance notice time on the basis of the producible count and a count of components to be supplied from each component feed part per the production of the one of the component mounted objects; and computer-readable program code operable to notify the lack of component in advance with respect to each component feed part when a count of remaining components at the component feed part becomes smaller than the advance notice remaining count at the component feed part corresponding to the count of remaining components.

BRIEF DESCRIPTION OF THE DRAWINGS

These and other aspects and features of the present invention will become clear from the following description taken in conjunction with the preferred embodiments thereof with reference to the accompanying drawings, in which:

FIG. 11 is a perspective view of a component feed part set in the component mounting apparatus of FIG. 10;

FIG. 12 is a diagram of a data structure of an NC program;

FIG. 14 is a diagram of an example of a conventional screen through which a count of remaining components and an advance notice remaining count are input;

DETAILED DESCRIPTION OF THE PREFERRED EMBODIMENTS

Figure 1:
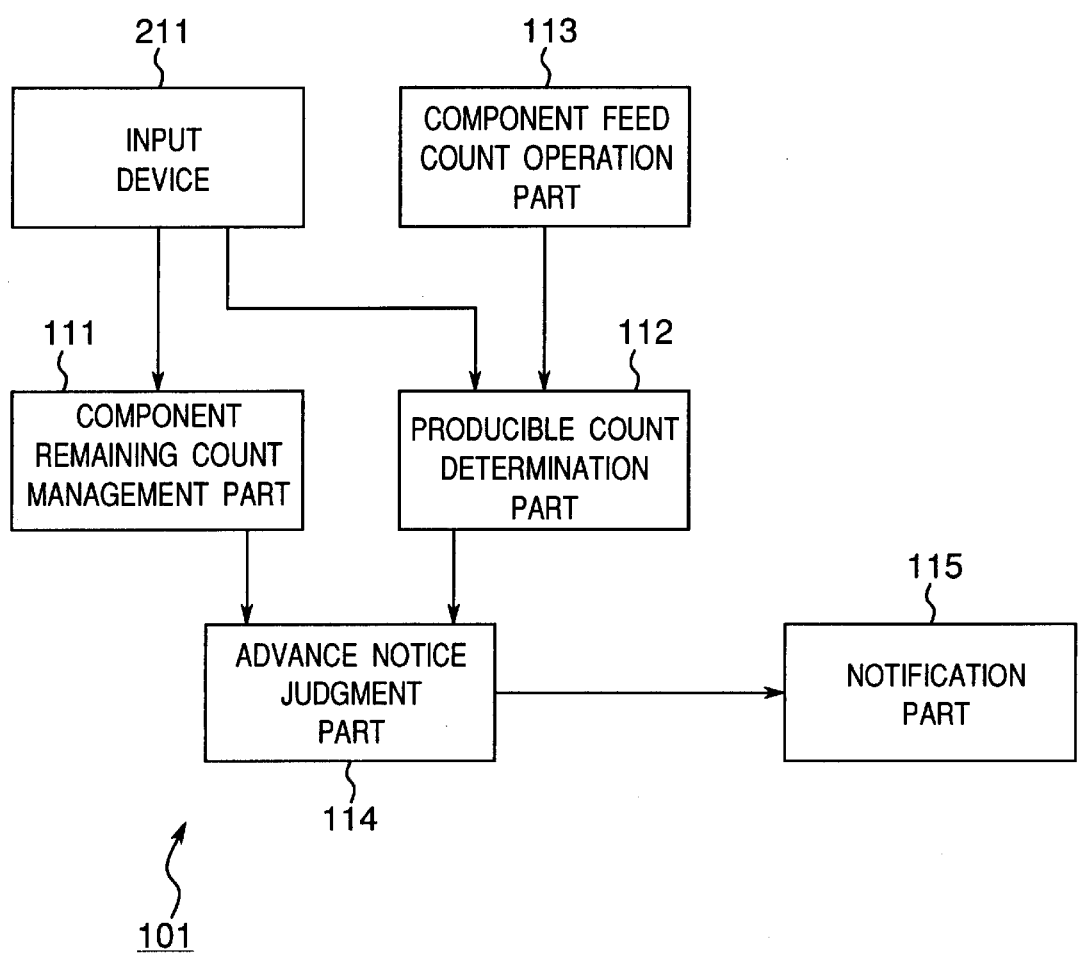
FIG. 1 is a block diagram schematically showing a constitution of a component-lack advance notice apparatus according to a first embodiment of the present invention.

An apparatus for notifying a lack of components in advance, a method for notifying a lack of components in advance, and a component mounting apparatus of examples embodying the present invention will be described below with reference to the drawings. The component-lack advance notice method is carried out by the component-lack advance notice apparatus, and the component mounting apparatus includes the component-lack advance notice apparatus or executes the component-lack advance notice method.

The same parts are designated by the same reference numerals in the drawings.

In the embodiments, an electronic component is discussed as an example of the "component" described in the foregoing "SUMMARY OF THE INVENTION", and similarly, a circuit board where the electronic component is mounted and a parts cassette are examples, respectively, of the "object to be mounted" and the "component feed part". However, the concept of the present invention is not limited specifically to the examples. The "advance notice parts" described in the "SUMMARY OF THE INVENTION" correspond to an advance notice judgment part 114 and a notification part 115 in the embodiments.

A prior art of giving the component-lack advance notice is disclosed in the publication of unexamined Japanese Patent application No. 4-164399. According to this prior art, a time until the lack of component takes place is informed to a worker on the basis of a count of remaining components at a component feed means. In contrast, according to the apparatus for notifying a lack of components in advance and the method for notifying a lack of components in advance in the embodiments of the present invention, a time from the advance notice of a components to an actual occurrence of the lack of components is set in conformity with a worker's convenience beforehand, and an advance notice remaining count of components at each of component feed parts is obtained on the basis of elements including the above time, so that the component lack is noticed in advance when a count of remaining components at each component feed part becomes smaller than the advance notice remaining count. The arrangement of the present invention will be detailed hereinbelow.

FIRST EMBODIMENT

Figure 6:
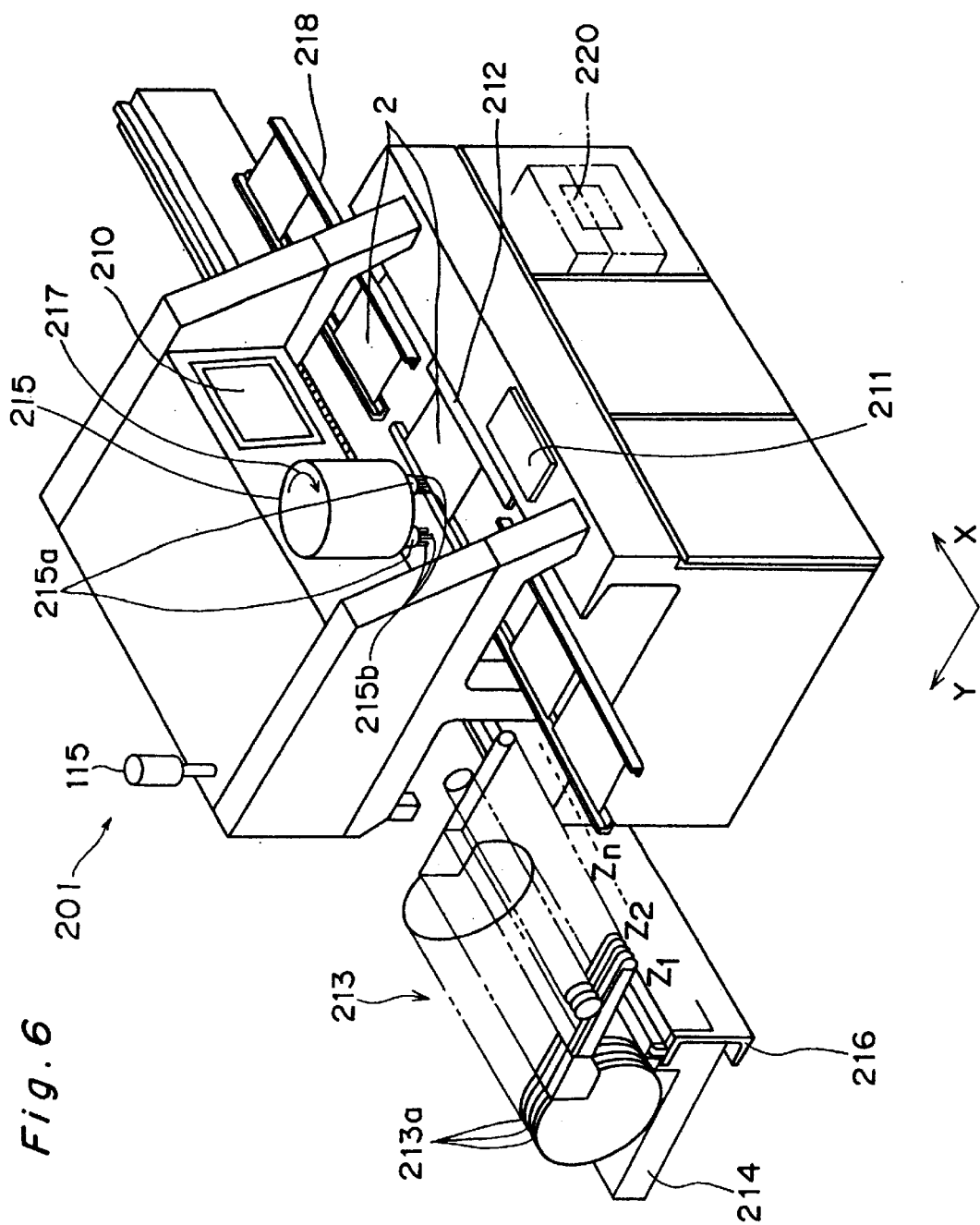
FIG. 6 is a perspective view of a component mounting apparatus according to an embodiment of the present invention which includes the component-lack advance notice apparatus of FIG. 1.

According to a first embodiment, a component-lack advance notice apparatus which notifies a lack of components in advance is set in a component mounting apparatus 201 shown in FIG. 6. The component mounting apparatus 201 corresponds to the related component mounting apparatus 1 depicted with reference to FIG. 10. Similar to the component mounting apparatus 1, the component mounting apparatus 201 comprises roughly an orthogonal table 212, a component feed device 213, a feed table 214, a component hold device 215, a circuit board transfer device 218, and a control device 220. Except the control device 220, each of parts constituting the component mounting apparatus 201 is adapted to function and operate substantially in the same way as each of corresponding parts of the component mounting apparatus 1, and therefore each part of the component mounting apparatus 201 will be described briefly below.

Figure 10:
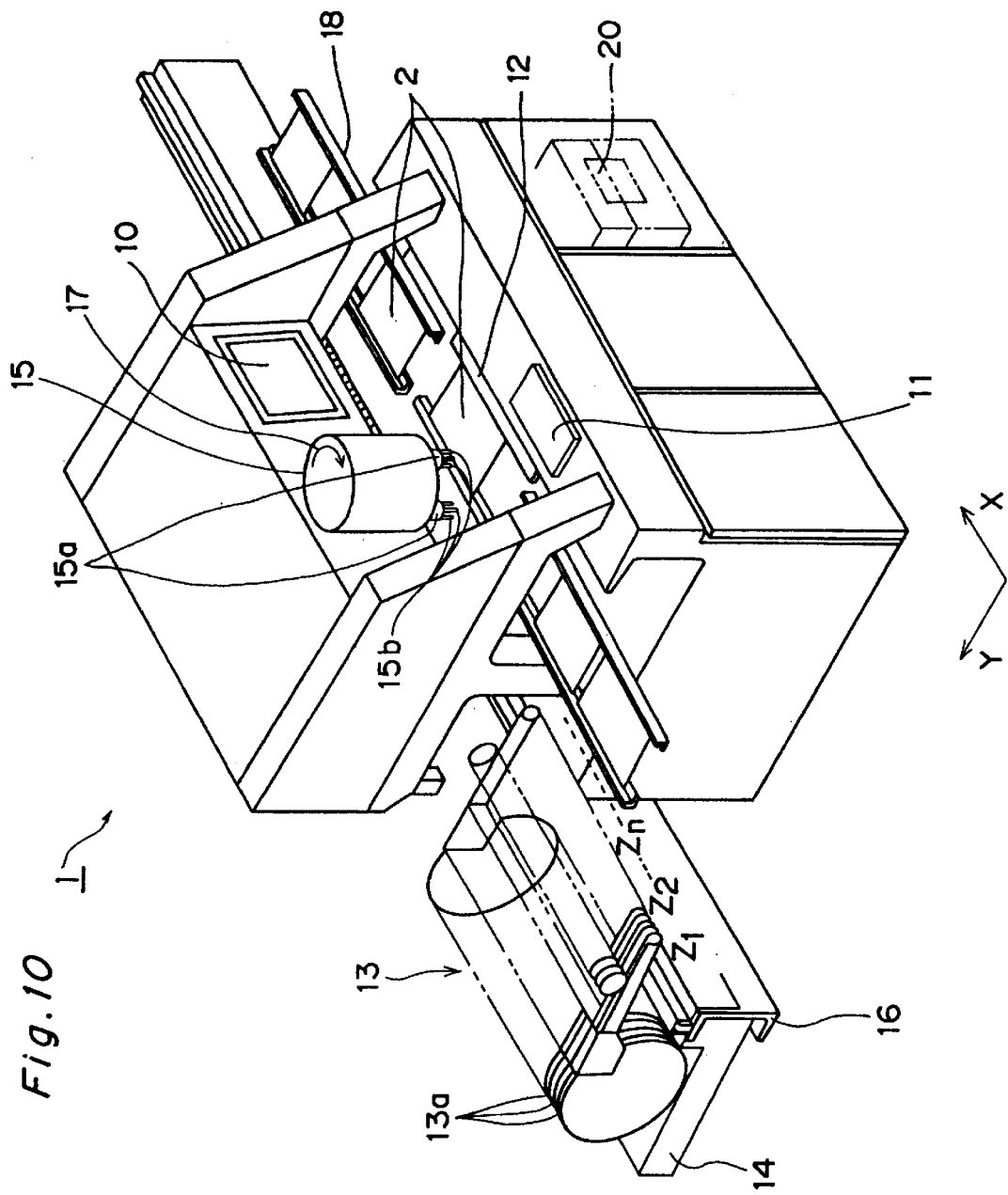
FIG. 10 is a perspective view of a conventional component mounting apparatus.

The orthogonal table 212 corresponds to the orthogonal table 12 of FIG. 10, which can move in X, Y directions to hold and position a circuit board 2 to mount electronic components.

Figure 13:
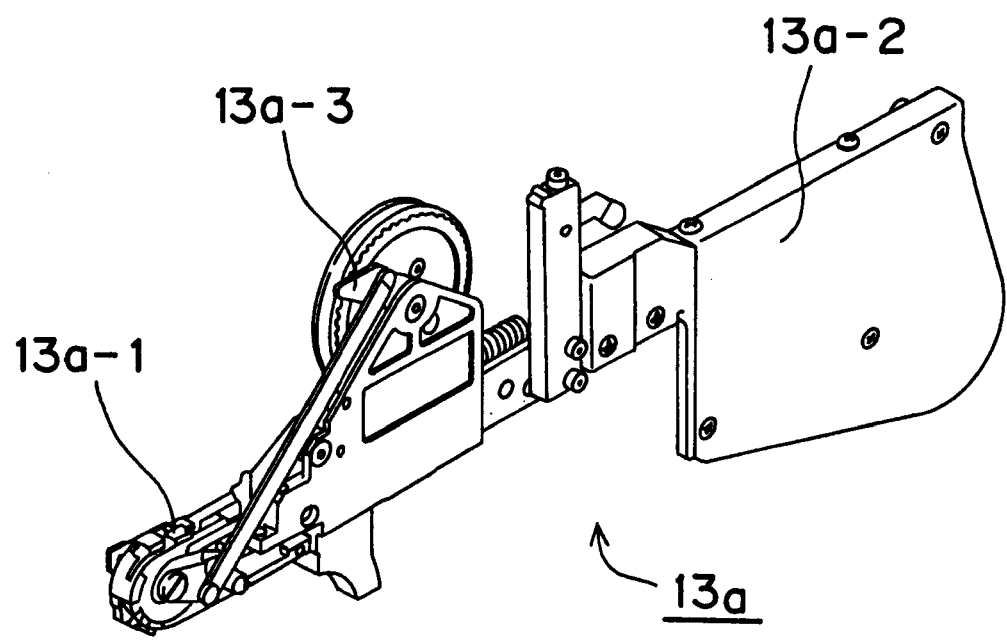
FIG. 13 is a diagram of a data structure of an array program.
Figure 15:
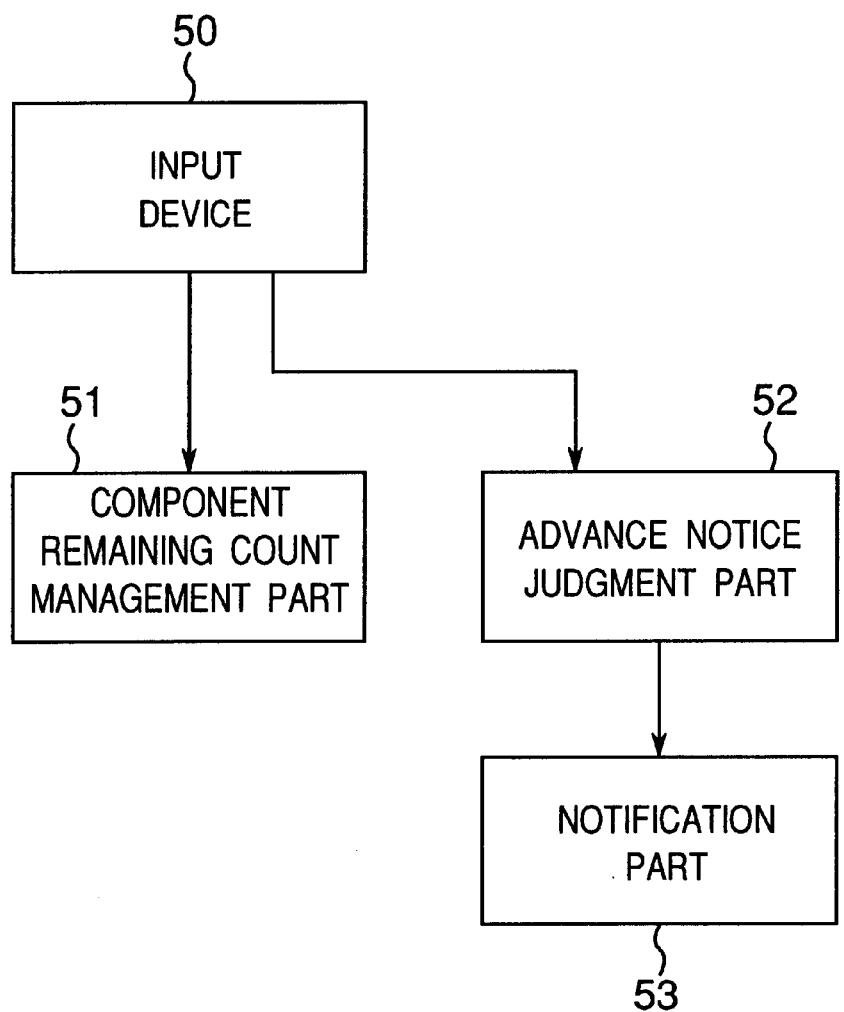
FIG. 15 is a block diagram of a structure processing a component-lack advance notice in the related art.
Figure 16:
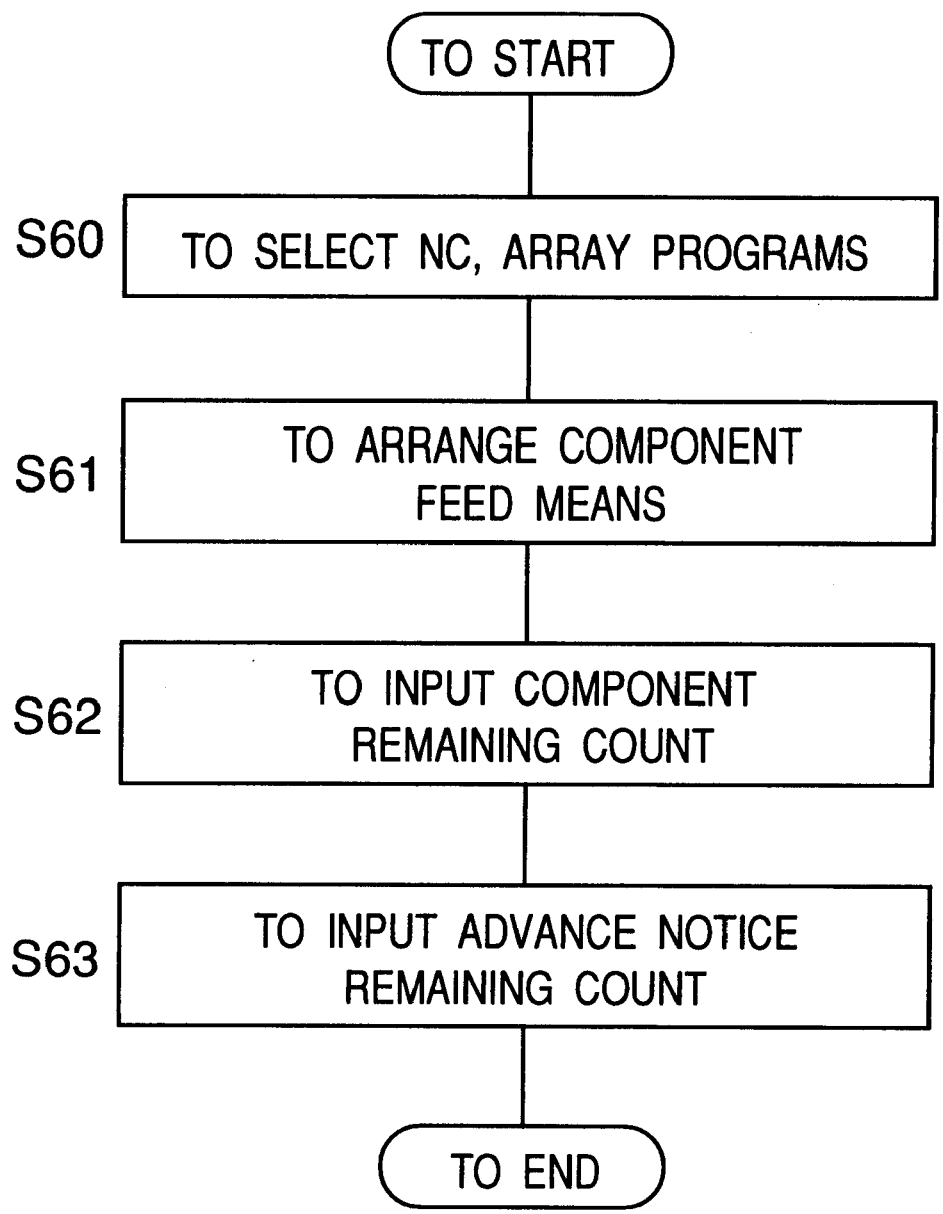
FIG. 16 is a flow chart of procedures executed at the switch of production types in the related art.
Figure 17:
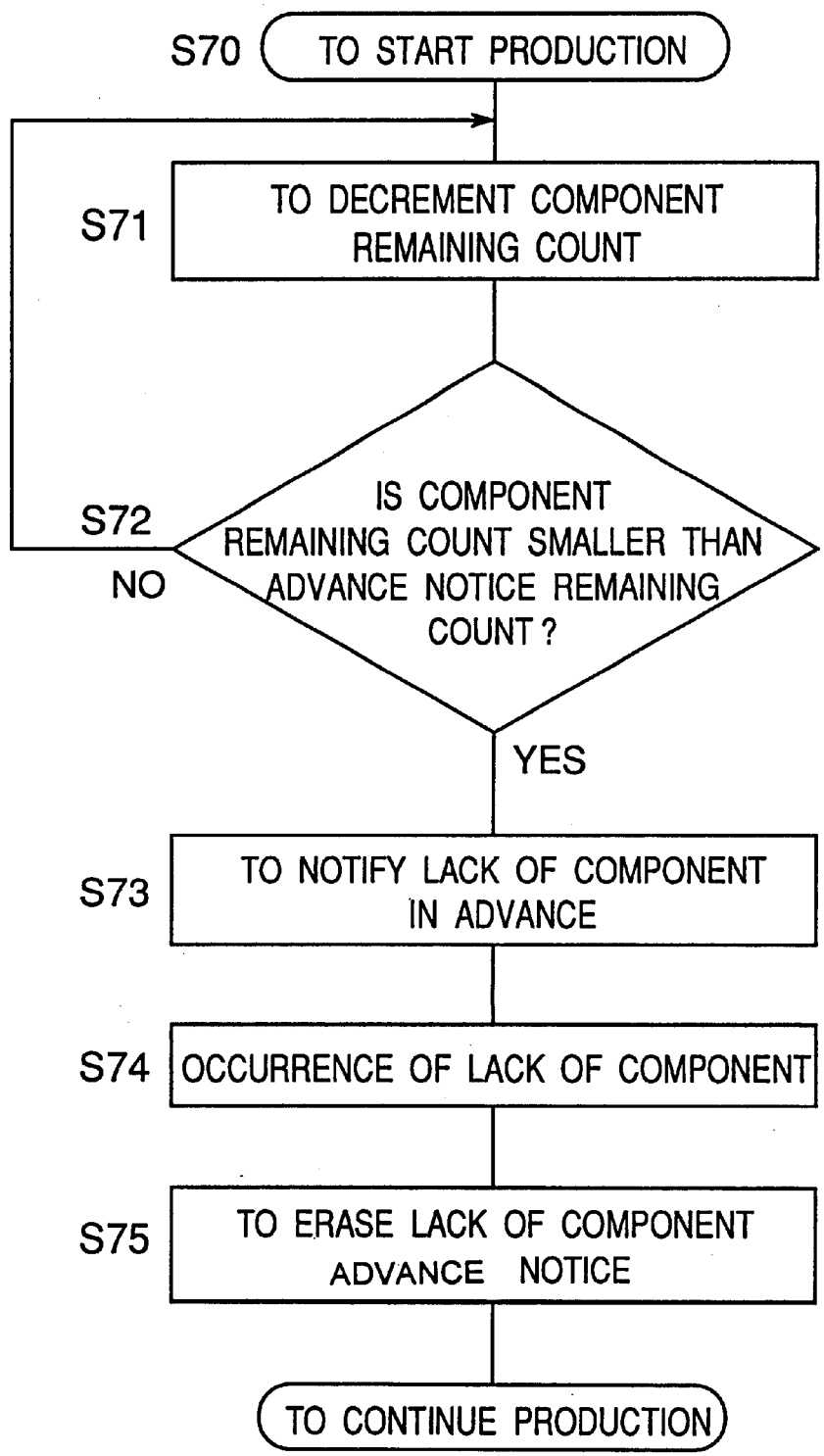
FIG. 17 is a flow chart of procedures executed at the component-lack advance notice during production in the related art.

The component feed device 213 corresponds to the component feed device 13 of FIG. 10, having a plurality of parts cassettes 213a which correspond to the parts cassettes 13a described with reference to FIG. 13 and are arranged side by side in the X direction.

The feed table 214 corresponding to the feed table 14 of FIG. 10 is equipped with unique Z numbers so that positions in the X direction where the table 214 loads the parts cassettes 213a can be recognized.

The component hold device 215 corresponds to the component hold device 15 of FIG. 10. The component hold device 215 is of a rotary head type rotatable in a direction of an arrow 217 about a rotational center axis, and having a plurality of mounting heads 215a and a plurality of nozzles 215b in each of the mounting heads 215a for sucking and holding electronic components. The component hold device 215 does not move in the X, Y directions, whereas each nozzle 215b can move up, down in a direction in which the nozzle 215b extends.

The circuit board transfer device 218 corresponding to the circuit board transfer device 18 of FIG. 10 transfers the circuit boards 2 into the component mounting apparatus 201 and sends the circuit boards out of the component mounting apparatus 201.

The control device 220 controls operations of the above-described constitution thereby controlling a mount operation for electronic components to the circuit boards 2. Moreover, according to the embodiment, the control device 220 including a part of the component-lack advance notice apparatus to be described below controls an operation for notifying a lack of components in advance.

Also, the component mounting apparatus 201 has a display screen 210 for displaying a state of the component mounting apparatus 201 and contents of data, and an input device 211 with a keyboard, etc. to be used for inputting data.

The component mounting apparatus 201 constituted as above sequentially mounts desired electronic components caught by the nozzles 215b from the parts cassettes 213a storing the desired electronic components to a predetermined mount position on the circuit board 2 sent by the circuit board transfer device 218 into the component mounting apparatus 201 and held at the orthogonal table 212. The component mounting apparatus then transfers, with the use of the circuit board transfer device 218, the circuit board 2 after all necessary electronic components are mounted thereto to a next process apparatus.

Figure 8:
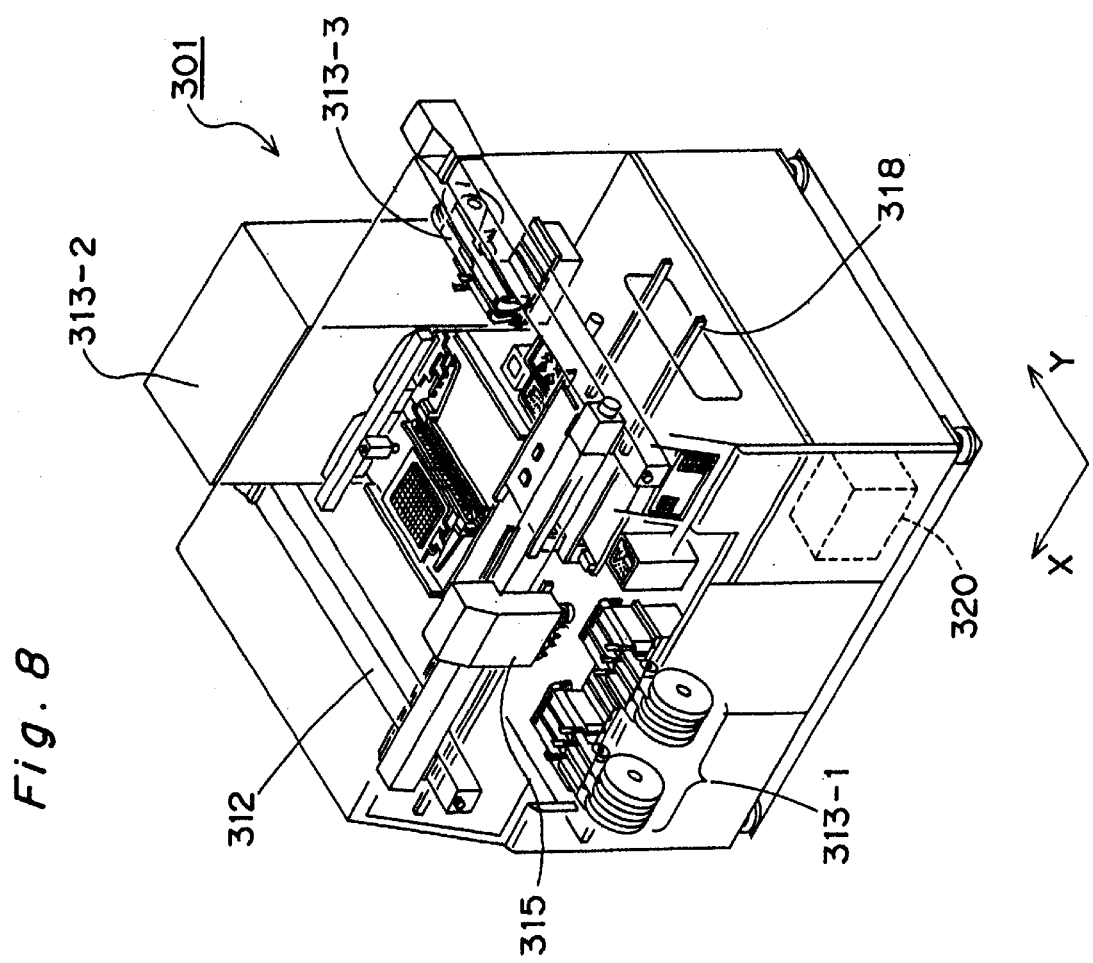
FIG. 8 is a perspective view of a modification of the component mounting apparatus of FIG. 6.

According to the embodiment, the component mounting apparatus employs the component hold device 215 of the rotary head type and the component feed device of the type equipped with the parts cassettes 213a as described above. However, the component mounting apparatus is not restricted to this constitution. For instance, an embodiment of the present invention is applicable to a component mounting apparatus 301 as shown in FIG. 8. The component mounting apparatus 301 has an orthogonal table 312 which corresponds to the orthogonal table 212 in view of positioning a position where electronic components are to be mounted on the circuit board 2. The orthogonal table 312 has a component hold device 315 set to be freely movable in the X, Y directions for mounting electronic components to a desired position of the fixed circuit board 2. 313-1 through 313-3 (sometimes denoted generally by a reference numeral 313) represent a component feed device for feeding electronic components. The component hold device 315 receives the electronic components from the component feed device 313 and mounts them on the circuit board 2. What is designated with a reference numeral 318 corresponds to the circuit board transfer device 218 and transfers circuit boards 2. 320 is a control device.

The component-lack advance notice apparatus in the embodiment will be discussed with reference to, for example, the above component mounting apparatus 201.

Broadly, the component-lack advance notice apparatus 101 shown in FIG. 1 comprises a component remaining count management part 111 for managing a count of remaining components, a producible count determination part 112, a component feed count operation part 113 for operating a count of components to be supplied, an advance notice judgment part 114, and a notification part 115. These parts excluding the notification part 115 are included within the control device 220.

Every time the electronic component is used during the production, the remaining count management part 111 sequentially subtracts one from an initial count of the electronic component of a parts cassette 213a supplying the electronic component with reference to, e.g., the NC program 30 discussed earlier, and keeps the count of remaining components for each parts cassette 213a. Each initial count of electronic components for each of component feed parts, namely, each parts cassette 213a is input by a worker with the utilization of the input device 211 of the component mounting apparatus 201.

Based on an advance notice time and an estimated production time to be described later, the producible count determination part 112 obtains a producible count of circuit boards on which the electronic components can be mounted within the advance notice time, and obtains for each parts cassette 213a each advance notice remaining count which is a count of components to be supplied from each parts cassette 213a within the advance notice time, on the basis of the producible count and each count of components to be supplied from each parts cassette 213a in order to produce one circuit board.

The above advance notice time is input by the worker through the input device 211. More specifically, the advance notice time is a time from a time point when the occurrence of lack of components is notified in advance to a time point when the lack of components actually takes place. The advance notice time is uniform for all the parts cassettes 213a. This advance notice time can be set in accordance with a time required by the worker to replace components at the occurrence of the lack of components at the parts cassettes 213a resulting from the supply of components, a state of inventory control and the like production form of each of customers.

The estimated production time is a time estimated to be consumed for producing the one circuit board, which is input by the worker through the input device 211.

Figures 3, 4:
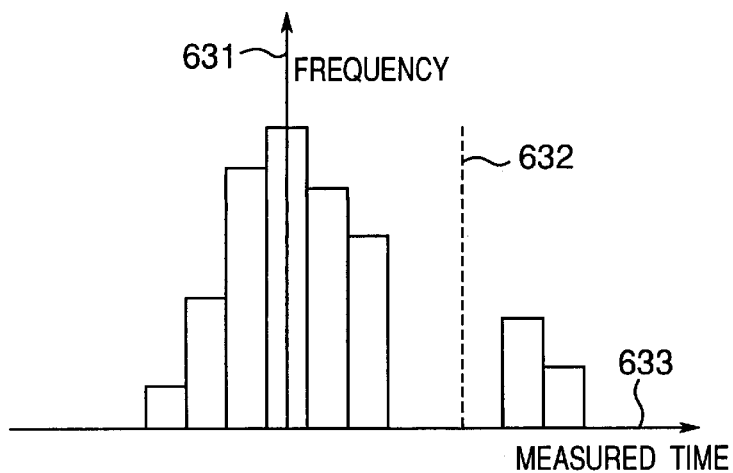
FIG. 3 is a diagram showing a structure of a table in which a producible count and an advance notice remaining count obtained by a producible count determination part shown in FIG. 1 are registered.
FIG. 4 is a graph of a frequency distribution for each time range required for producing one circuit board.

The producible count determination part 112 holds information in a table structure as shown in FIG. 3 in which the advance notice time, the estimated production time, the producible count, and the advance notice remaining count are registered. The producible count and the advance notice remaining count are obtained on the basis of the count of components to be supplied from each parts cassette 213a to produce the one circuit board.

In FIG. 3, 401 is the advance notice time and 402 is the estimated production time. 403 is the Z number, and indicates a list of Z numbers 33 actually used in the NC program 30 among the Z numbers 33 defining component names in the array program 40, namely, Z numbers 33 of the parts cassettes 213a on the feed table 214. 404 is the count of components to be supplied which is calculated for each of Z numbers 33 from the NC program 30 and array program 40. 405 is the producible count obtained by dividing the advance notice time by the estimated production time for each Z number 33. 406 is the advance notice count obtained by multiplying the count of components to be supplied and producible count for every Z number 33.

For instance, for the parts cassette 213a with the Z number "1", the producible count 405 is calculated to be "5" by dividing the advance notice time 401 of 5 minutes (300 seconds) by the estimated production time 402 of "60 seconds". At this time, the count 404 of components to be supplied from the parts cassette 213a with the Z number "1" is "5", and consequently the advance notice count 406 is calculated to be "25" by multiplying the count of components to be supplied, i.e., "5" by the producible count of "5". Values for the parts cassette 213a of each Z number are calculated in the same manner.

When the production type is changed, the producible count 405 and the advance notice count 406 are automatically updated by the producible count determination part 112 based on the count 404 of components to be supplied which has been updated subsequent to the change in production type, the advance notice time 401 input beforehand, and the estimated production time 402. Moreover, the producible count 405 and the advance notice count 406 are similarly automatically updated by the producible count determination part 112 even when the advance notice time 401 or the estimated production time 402 is updated by the worker after the production type is changed.

In the manner as described above, the producible count 405 and the advance notice count 406 are automatically updated to be optimum by the producible count determination part 112 based on the production type and advance notice time 401 in the calculation method discussed earlier.

The component feed count operation part 113 obtains the count 404 of components to be supplied. According to the embodiment, the count 404 is obtained for every parts cassette 213a on the basis of the NC program 30 shown in FIG. 11 which is a mount program used in producing circuit boards and regulates electronic components to be mounted on the circuit board 2 in the order of mounting, and the array program 40 of FIG. 12 which regulates the arrangement of parts cassettes 213a feeding the electronic components.

Although the count 404 of components to be supplied is determined on the basis of the NC program 30 and array program 40 described as above according to the embodiment, as the array program 40 may be sometimes one that shows only kinds of electronic components in the parts cassettes 213a and in such case, the count 404 of components to be supplied may be obtained on the basis of the NC program 30 alone if kinds of electronic components do not matter.

The component feed count operation part 113 enables automatic determination of the count 404 of components to be supplied for every parts cassette 213a. Therefore, when types of circuit boards to be produced are switched or on the like occasion, the worker's need for referring to the NC program to obtain the count 404 of components to be supplied for each parts cassette 213a, etc. is eliminated, the worker's burden is lessened and operation efficiency is enhanced more than the related art.

As described hereinabove, while the count 404 of components to be supplied is obtained through calculations operations in the embodiment, for instance, the worker can input a fresh count 404 from the input device 211 when, for example, types of circuit boards to be produced are changed.

The advance notice judgment part 114 compares the advance notice count 406 of each parts cassette 213a obtained and provided by the producible count determination part 112 with the count of components remaining at each parts cassette 213a sent from the component remaining count management part 111, and sends out a signal to the notification part 115 when the count of remaining components becomes smaller than the advance notice count 406.

The notification part 115 comprises a message display part, a signal tower or the like for informing a component replacement timing or an apparatus abnormality to the worker, effecting a message display or turning on the signal tower upon receipt of the signal from the advance notice judgment part 114 to inform the worker to replace components, etc.

The component-lack advance notice apparatus 101 in the above constitution operates in a manner as described hereinbelow.

Figure 2:
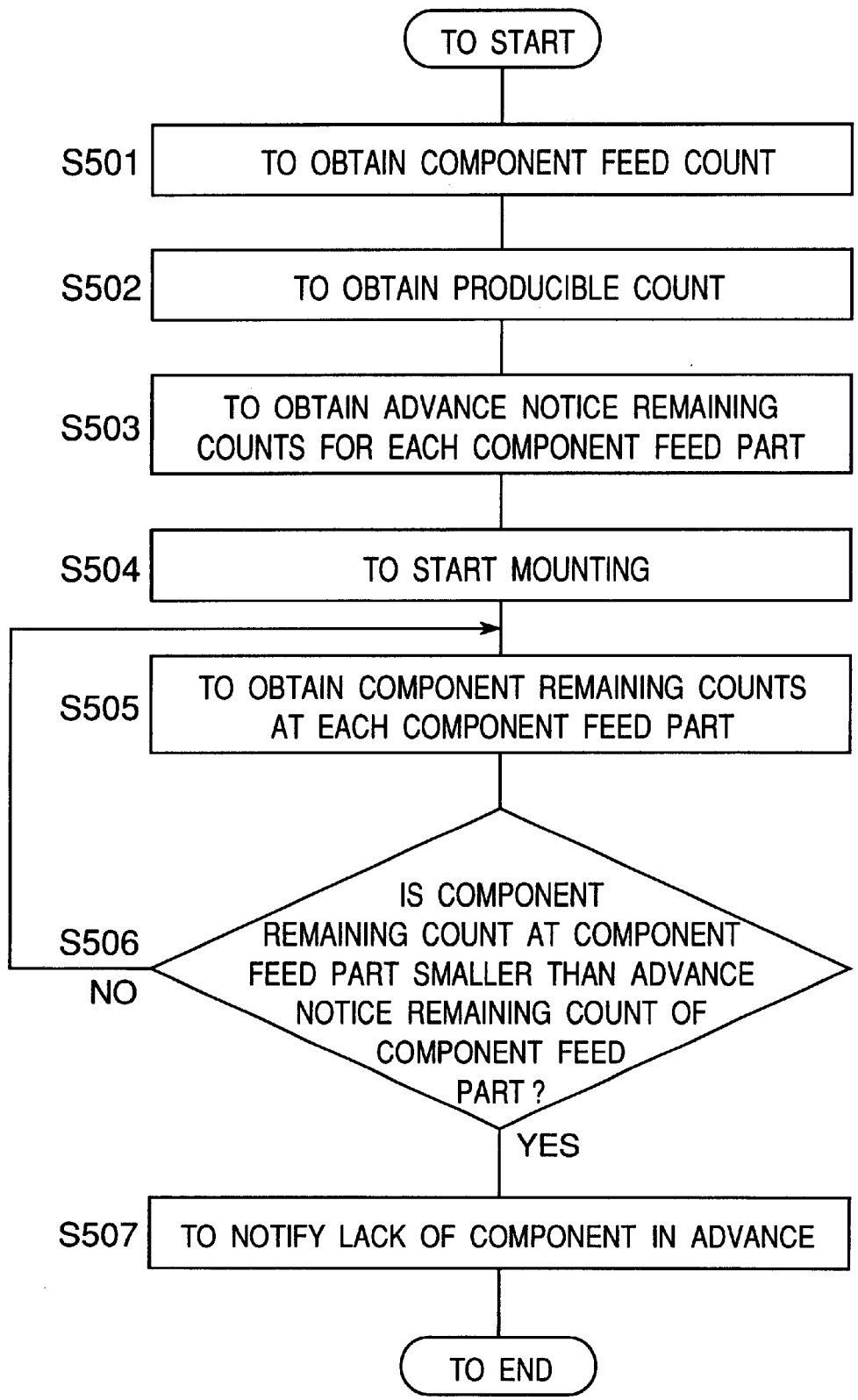
FIG. 2 is a flow chart of the operation of the component-lack advance notice apparatus of FIG. 1.

FIG. 2 is a flow chart of a sequence of operations on the occasion of the component-lack advance notice including procedures for updating automatically the advance notice count 406 which is carried out when types to be produced are switched.

In step 501, based on the NC program 30 of FIG. 11 and array program 40 of FIG. 12 used in mounting and producing the circuit board, the component count operation part 113 obtains for each parts cassette 213a the count 404 of components to be supplied which is the number of electronic components consumed by each parts cassette 213a to produce one sheet of the circuit board 2.

In step 502, the producible count determination part 112 obtains, on the basis of the preliminarily input advance notice time 401 and the estimated production time 402, the producible count 405 which is a count of circuit boards to be producible within the advance notice time 401 by dividing the advance notice time 401 by the estimated production time 402. Although the producible count 405 is obtained by the calculation in the embodiment, the embodiment is not limited to this and a known method, for example, with using a reference table, etc. may be naturally adopted.

In step 503, the producible count determination part 112, with reference to the above-obtained producible count 405 and the count 404 of components to be supplied from each parts cassette 213a, obtains the advance notice remaining count 406 for each parts cassette 213a by multiplying the producible count 405 and the count 404. Although the advance notice count 406 is obtained by the calculation according to the embodiment, the embodiment is not restricted to this way and, e.g., a reference table can be used to obtain the advance notice count or the like known method is naturally utilizable.

In step 504, the component mounting apparatus 201 starts the mount operation through control by the control device 220 based on the NC program 30. Subsequent to the start of the mount operation, every time the electronic component is mounted, the component remaining count management part 111 obtains on the basis of the NC program 30 and array program 40 the count of remaining components in the parts cassette 213a which has stored the used electronic component (step 504). Moreover, the start of the mount operation makes the advance notice judgment part 114 compare for each parts cassette 213a whether or not the count of remaining components is smaller than the advance notice remaining count 406 in step 506. When the count of remaining components is detected to be smaller than the advance notice remaining count 406 by the comparison, the advance notice judgment part 114 sends the signal to the notification part 115 which in turn gives the worker the advance notice of component lack.

As described hereinabove, the component-lack advance notice apparatus 101 set in the mounting apparatus enables the worker to input the advance notice time 401 by the input device 211. Thus, the worker can set the time 401 when the lack of component takes place in the parts cassette 213a because of the supply of the component from the parts cassette 213a, in conformity with a time required for the replacement of components, an inventory management state or the like, namely production state of the customer. Therefore, even when the count 404 of electronic components to be supplied from each parts cassette 213a varies among the types of circuit boards to be produced, the lack of component can be always noticed in advance to the worker at a time point preceding the actual lack of component by the equal time.

Further, the producible count 405 is obtained on the basis of the advance notice time 401 that can be set appropriately as above and the estimated production time 402, so that the advance notice remaining count 406 is automatically detected on the basis of the producible count 405 and count 404 of components to be supplied. The advance notice remaining count 406 of a different value is automatically allotted to each parts cassette 213a, thus eliminating the conventional need of the worker's registering the advance notice remaining count 406 when production types are switched, etc. The procedures, e.g., at the change of types of circuit boards are lessened and a time corresponding to the lessened procedures time is omitted. The worker's trouble at the replacement of components is reduced and the replacement is carried out efficiently in comparison with the related art.

SECOND EMBODIMENT

Figure 7:
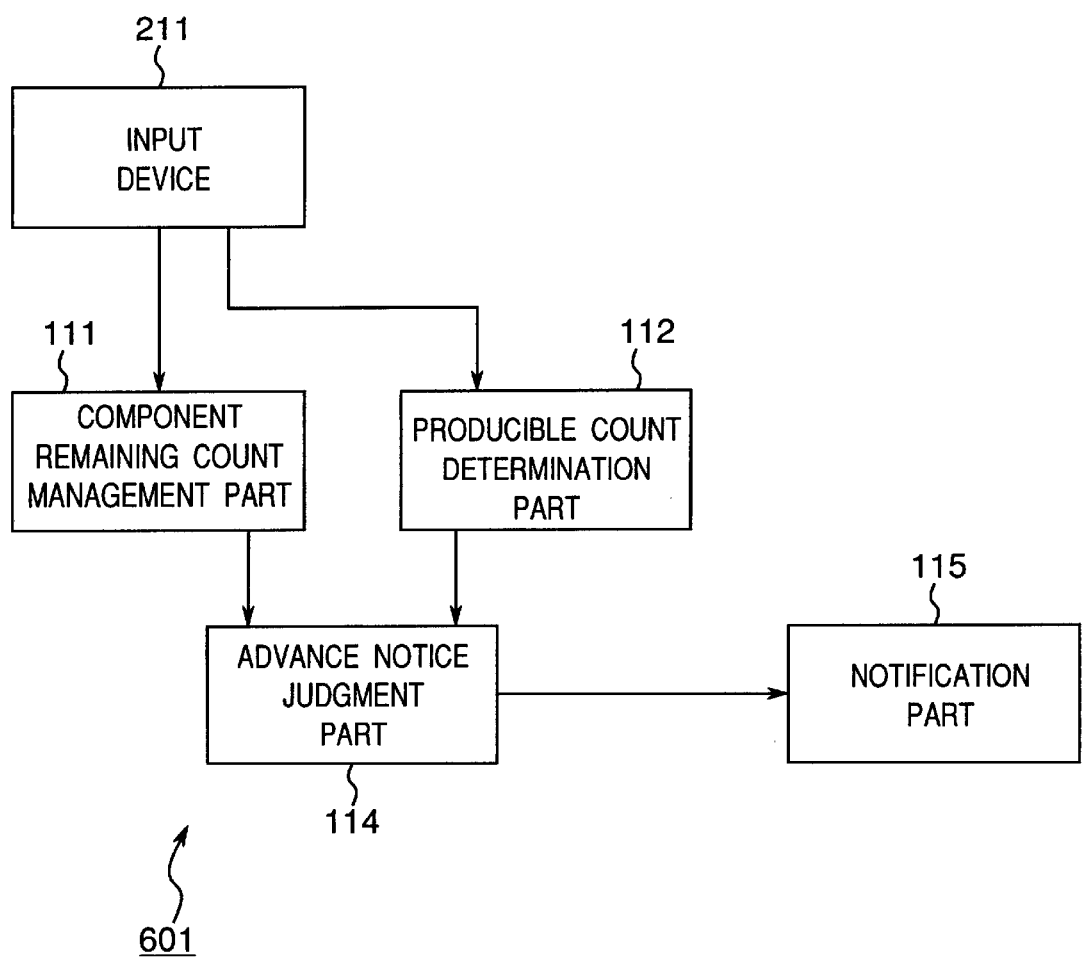
FIG. 7 is a block diagram of a component-lack advance notice apparatus according to a second embodiment which is a modified example of the component-lack advance notice apparatus of FIG. 1.

While the count 404 of components to be supplied is obtained at the component feed count operation part 113 in the above-described component-lack advance notice apparatus 101, the count 404 can be input by the worker from the input device 211 according to a component-lack advance notice apparatus 601 in the constitution as shown in FIG. 7.

THIRD EMBODIMENT

Figure 9:
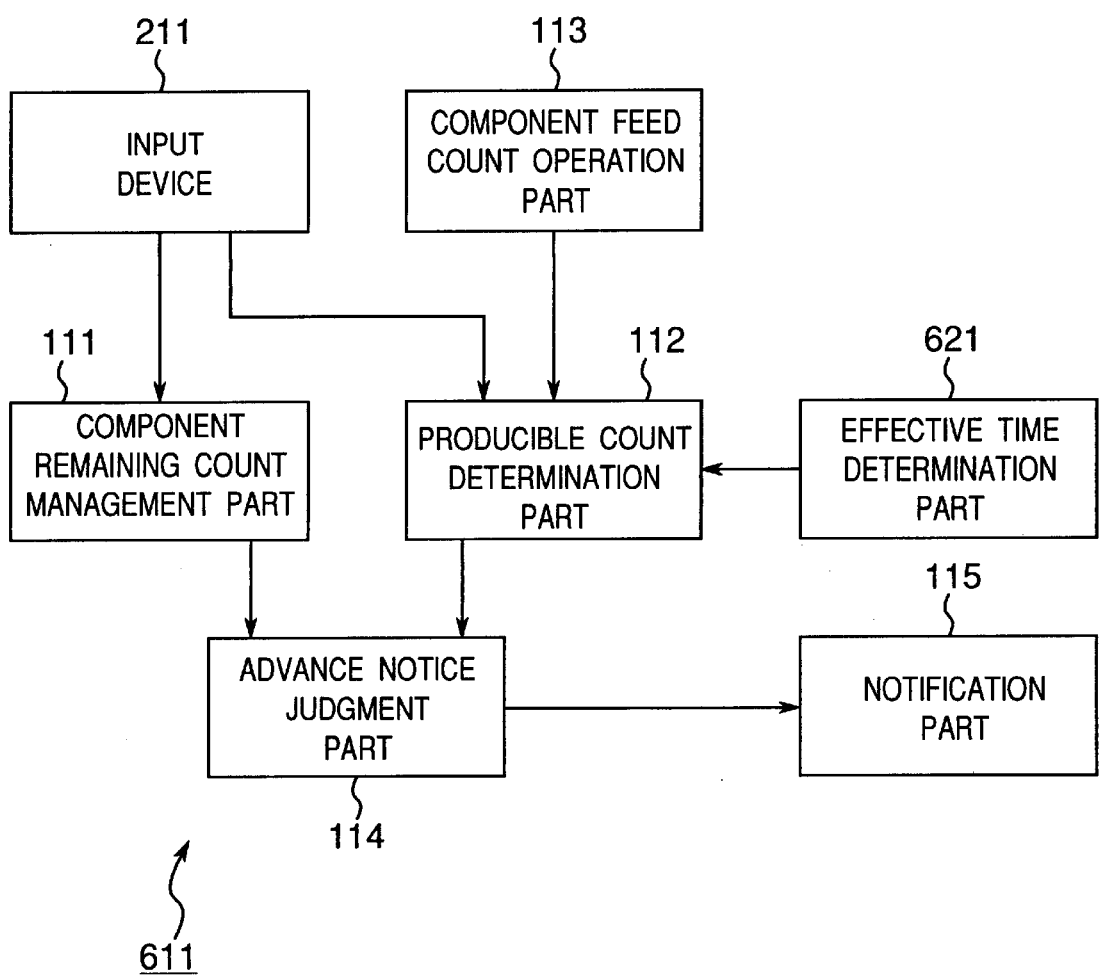
FIG. 9 is a block diagram of a component-lack advance notice apparatus according to a third embodiment of the present invention which is a modification of the component-lack advance notice apparatus of FIG. 1.

The component-lack advance notice apparatus 101 necessitates the worker to input the estimated production time 402 per one sheet of the circuit board beforehand. To solve this, an effective time determination part 621 may be added as in a component-lack advance notice apparatus 611 of FIG. 9, thereby measuring a production time per the one circuit board and automatically sending an appropriate value to the producible count determination part 112. The operation of the effective time determination part 621 will be described in detail below.

A graph of FIG. 4 shows a frequency distribution for each of time ranges obtained by measuring a time consumed for producing the one circuit board in a component mounting apparatus equipped with the component-lack advance notice apparatus 611 for a plurality of number of times. In FIG. 4, 633 indicates an axis of a measured time, 631 is an axis of the frequency, and 632 is a measured time as a threshold value for regulating an outside of an effective range. The measured time 633 is defined as a time interval from a measurement start time when the circuit board 2 is carried to the orthogonal table 212 from an upstream process of the component mounting apparatus to a measurement end time when the circuit board 2 after having electronic components completely mounted thereto is sent out of the orthogonal table 212 and a next circuit board 2 is supplied to the orthogonal table 212 from the upstream process, with taking a line balance of the upstream process and a downstream process of the mounting apparatus to be measured into consideration. If values of measured samples are averaged so as to obtain an effective value of the measured time 633, since the times 633 may be sometimes abnormally prolonged, for example, because the circuit boards 2 cannot be supplied from the upstream process or cannot be sent out to the downstream process, the averaged value becomes invalid as the measured time. For solving this problem, the threshold value 632 is set and the measured time exceeding the threshold value 632 is neglected as outside the effective range. The measured time should be thus obtained statistically from the frequency distribution within the effective range.

The operation of the component-lack advance notice apparatus 611 with the effective time determination part 621 will be discussed below.

Figure 5:
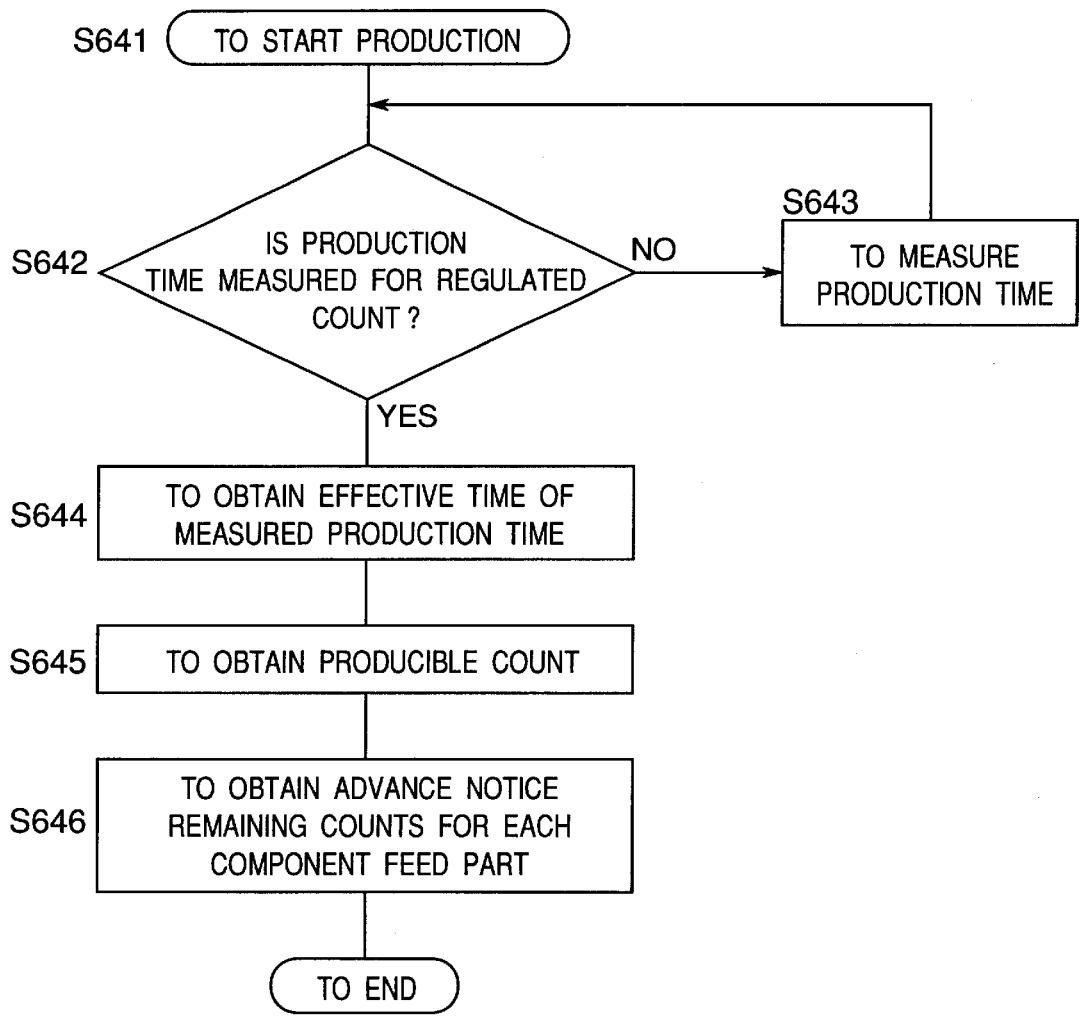
FIG. 5 is a flow chart of procedures for automatically updating the advance notice count based on an effective production time among the operation carried out by the component-lack advance notice apparatus in FIG. 9.

FIG. 5 is a flow chart of procedures for automatically updating the advance notice remaining count 406 to be supplied to the advance notice judgment part 114 based on the effective time of a production time. In FIG. 5, after the production is started immediately after the switch of product types (step 641), electronic components are mounted to the circuit boards of a preliminarily regulated count (step 642), and the measured time of each of productions of the circuit boards is measured (step 643). The component-lack advance notice is not performed during the measurement. The effective time determination part 621 obtains the frequency distribution of FIG. 4 from the measured times and calculates the effective time (step 644).

The effective production time obtained as above is supplied to the producible count determination part 112. The producible count determination part 112 obtains the producible count 405 based on the effective time and the advance notice time 401 input by the worker beforehand by dividing the advance notice time 401 by the effective time as described before (step 645).

On the basis of the obtained producible count 405 and the count 404 of components for each parts cassette 213*a*, the producible count determination part 112 obtains the advance notice remaining count 406 for each parts cassette 213*a* by multiplying the counts 405 and 404 as discussed earlier (step 646).

The component-lack advance notice apparatus 611 enhances accuracy in time required for producing the one circuit board, thereby achieving more correct advance notice than the preliminarily input advance notice time from the advance notice of the component lack to the actual generation of the lack of component. Owing to the correct advanced notification of component lack, the worker's work efficiency is improved and a stop time of the component mounting apparatus caused by the lack of component is shortened, with availability enhanced.

In the third embodiment, the effective production time is obtained by producing the circuit boards actually and measuring the measured times. Alternatively, a production estimation time can be obtained by simulations on the basis of a distance of mount positions at each circuit board to be produced, a movement distance of the feed table 214 at the mount operation, and a mount time for each component, which is then applied to the calculation for the advance notice remaining count 406.

The control operation for executing the component-lack advance notice method in each of the embodiments may be supplied by a computer usable medium recording the control operation, for example, a CD-ROM and the like, and a communications network.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A component-lack advance notice apparatus for notifying a lack of a component in advance at each of a plurality of component feed parts, the lack of the component being brought about when each of a plurality of components supplied from each of the component feed parts constituting a component mounting apparatus is mounted to each of objects to be mounted, thereby producing component mounted objects, said apparatus comprising:

a producible count determination part to which an advance notice time and an estimated production time are supplied, the advance notice time being a time from the advance notice of the lack of the component to an actual occurrence of the lack of the component at the component feed part and being uniform for all component feed parts, the estimated production time being estimated to be required for producing one of the component mounted objects, said producible count determination part being operable to obtain a producible count of the component mounted object within the advance notice time on the basis of the advance notice time and estimated production time and also being operable to obtain an advance notice remaining count for each component feed part which is a count of components to be supplied from each component feed part within the advance notice time on the basis of the producible count and a count of components to be supplied from each component feed part per a production of one of the component mounted objects; and an advance notice part operable to notify the lack of the component in advance with respect to each component feed part when a count of remaining components at the component feed part becomes smaller than the advance notice remaining count at the component feed part corresponding to the count of remaining components.

2. A component-lack advance notice apparatus according to claim 1, further comprising a component feed count operation part operable to obtain and supply the count of components to be supplied on the basis of a mounting program for regulating the component feed parts in a mount order for feeding components to be mounted to the objects.

3. A component-lack advance notice apparatus according to claim 1, wherein the advance notice time is supplied to said producible count determination part as a preset time set in relation to a replacement work subsequent to the occurrence of the lack of the component or a switch work for production types of objects to be mounted, and the estimated production time is supplied as a preset time to said producible count determination part.

4. A component-lack advance notice apparatus according to claim 2, wherein the advance notice time is supplied to said producible count determination part as a preset time set in relation to a replacement work subsequent to the occurrence of the lack of the component or a switch work for production types of objects to be mounted, and the estimated production time is supplied as a preset time to said producible count determination part.

5. A component-lack advance notice apparatus according to claim 1, further comprising an effective time determination part operable to obtain an effective time from a plurality of measured samples as an actually measured time to actually produce the one of the component mounted objects.

6. A component-lack advance notice apparatus according to claim 2, further comprising an effective time determination part operable to obtain an effective time from a plurality of measured samples as an actually measured time to actually produce the one of the component mounted objects.

7. A component-lack advance notice apparatus according to claim 1, wherein the estimated production time is obtained by performing simulations on a basis of a mount time for each component, and wherein the obtained estimated production time is supplied to said producible count determination part.

8. A component mounting apparatus which comprises the component-lack advance notice apparatus according to claim 1.

9. A component-lack advance notice method for notifying a lack of a component in advance at each of a plurality of component feed parts, the lack of the component being brought about when each of a plurality of components supplied from each of the component feed parts is mounted to each of objects to be mounted, thereby producing component mounted objects, said method comprising:

supplying a count of components to be supplied from each component feed part per a production of one of the component mounted objects, supplying an advance notice time and an estimated production time, the advance notice time being a time from the advance notice of the lack of the component to an actual occurrence of the lack of the component at the component feed part and being uniform for all component feed parts, the estimated production time being estimated to be required for producing the one of the component mounted objects, and obtaining a producible count of the component mounted object within the advance notice time on the basis of the advance notice time and estimated production time and also obtaining an advance notice remaining count for each component feed part which is a count of components to be supplied from each component feed part within the advance notice time on the basis of the producible count and a count of components to be supplied from each component feed part per the production of the one of the component mounted objects; and notifying the lack of the component in advance with respect to each component feed part when a count of remaining components at the component feed part becomes smaller than the advance notice remaining count at the component feed part corresponding to the count of remaining components.

10. A component-lack advance notice method according to claim 9, wherein the count of components to be supplied is obtained on the basis of a mounting program for regulating the component feed parts in a mount order for feeding components to be mounted to the objects.

11. A component-lack advance notice method according to claim 9, wherein the advance notice time is supplied as a time set in relation to a replacement work subsequent to the occurrence of the lack of the component or a switch work for production types of objects to be mounted, and the estimated production time is supplied as a preset time.

12. A component-lack advance notice method according to claim 10, wherein the advance notice time is supplied as a time set in relation to a replacement work subsequent to the occurrence of the lack of the component or a switch work for production types of objects to be mounted, and the estimated production time is supplied as a preset time.

13. A component-lack advance notice method according to claim 9, wherein the estimated production time is an effective time to produce one of the component mounted objects which is obtained from a plurality of actually measured values of samples.

14. A component-lack advance notice method according to claim 10, wherein the estimated production time is an effective time to produce one of the component mounted objects which is obtained from a plurality of actually measured values of samples.

15. A component-lack advance notice method according to claim 9, in which an advance notice count is obtained on the basis of a fresh count of components to be supplied without changing the advance notice time by supplying the fresh count of components to be supplied for each component feed part when a production type of objects to be mounted is switched.

16. A component-lack advance notice method according to claim 11, in which an advance notice count is obtained on the basis of a fresh count of components to be supplied without changing the advance notice time by supplying the fresh count of components to be supplied for each component feed part when the production type of objects to be mounted is switched.

17. A component-lack advance notice method according to claim 12, in which an advance notice count is obtained on the basis of a fresh count of components to be supplied without changing the advance notice time by supplying the fresh count of components to be supplied for each component feed part when the production type of objects to be mounted is switched.

18. A component-lack advance notice method according to claim 13, in which an advance notice count is obtained on the basis of a fresh count of components to be supplied without changing the advance notice time by supplying the fresh count of components to be supplied for each component feed part when a production type of objects to be mounted is switched.

19. A component-lack advance notice method according to claim 14, in which an advance notice count is obtained on the basis of a fresh count of components to be supplied without changing the advance notice time by supplying the fresh count of components to be supplied for each component feed part when a production type of objects to be mounted is switched.

20. An article of manufacture comprising:

a computer usable medium, including computer-readable program code embodied therein, operable to cause a computer to notify a lack of a component in advance at each of a plurality of component feed parts, the lack of the component being brought about when each of a plurality of components supplied with a different component count from each of the component feed parts is mounted to each of objects to be mounted, thereby producing component mounted objects, said computer-readable program code in said article of manufacture comprising:

computer-readable program code operable to supply a count of components to be supplied from each component feed part per a production of one of the component mounted objects;

computer-readable program code operable to supply an advance notice time and an estimated production time, the advance notice time being a time from the advance notice of the lack of the component to an actual occurrence of the lack of the component at the component feed part and being uniform for all component feed parts, the estimated production time being estimated to be required for producing the one of the component mounted objects, and obtain a producible count of the component mounted object within the advance notice time on the basis of the advance notice time and estimated production time and also obtain an advance notice remaining count for each component feed part which is a count of components to be supplied from each component feed part within the advance notice time on the basis of the producible count and a count of components to be supplied from each component feed part per the production of the one of the component mounted objects; and computer-readable program code operable to notify the lack of the component in advance with respect to each component feed part when a count of remaining components at the component feed part becomes smaller than the advance notice remaining count at the component feed part corresponding to the count of remaining components.

* * * * *

UNITED STATES PATENT AND TRADEMARK OFFICE
CERTIFICATE OF CORRECTION

PATENT NO.   : 6,629,007 B1
DATED        : September 30, 2003
INVENTOR(S)  : Yoshiyuki Hattori et al.

It is certified that error appears in the above-identified patent and that said Letters Patent is hereby corrected as shown below:

<u>Column 15,</u>
Line 63, please insert a line break and replace "objects, supplying" with
-- objects;
    supplying --.

Signed and Sealed this

Thirteenth Day of April, 2004

JON W. DUDAS
*Acting Director of the United States Patent and Trademark Office*